(12) United States Patent
Sato et al.

(10) Patent No.: US 8,223,912 B2
(45) Date of Patent: Jul. 17, 2012

(54) TRANSFER APPARATUS, AND JITTER CONTROL METHOD OF TRANSMISSION SIGNAL

(75) Inventors: Tomoko Sato, Kawasaki (JP); Sunao Itou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 129 days.

(21) Appl. No.: 12/938,489

(22) Filed: Nov. 3, 2010

(65) Prior Publication Data

US 2011/0110474 A1  May 12, 2011

(30) Foreign Application Priority Data

Nov. 6, 2009  (JP) .................................. 2009-255146

(51) Int. Cl.
H03D 3/24 (2006.01)

(52) U.S. Cl. ..................... 375/376; 331/177 R; 331/179

(58) Field of Classification Search .................... 375/30, 375/371–376; 331/177 R, 179
See application file for complete search history.

(56) References Cited

U.S. PATENT DOCUMENTS

2011/0115539 A1* 5/2011 Brekelmans .................. 327/285

FOREIGN PATENT DOCUMENTS

JP  63-061594 A  3/1988
JP  2527832 U  8/1990

* cited by examiner

*Primary Examiner* — Curtis Odom
(74) *Attorney, Agent, or Firm* — Fujitsu Patent Center

(57) ABSTRACT

A transfer apparatus includes a receiver to receive an input signal and to extract a clock signal from the input signal, an input signal interruption detector to detect whether an input signal is input, an oscillator, and a frequency setter to set an oscillation frequency of the oscillator such that a difference between the oscillation frequency of the oscillator and a frequency of a frequency division signal into which a clock signal extracted from the input signal is frequency-divided falls out of a passband width of a filter when the input signal interruption detector detects the input of the input signal.

8 Claims, 7 Drawing Sheets

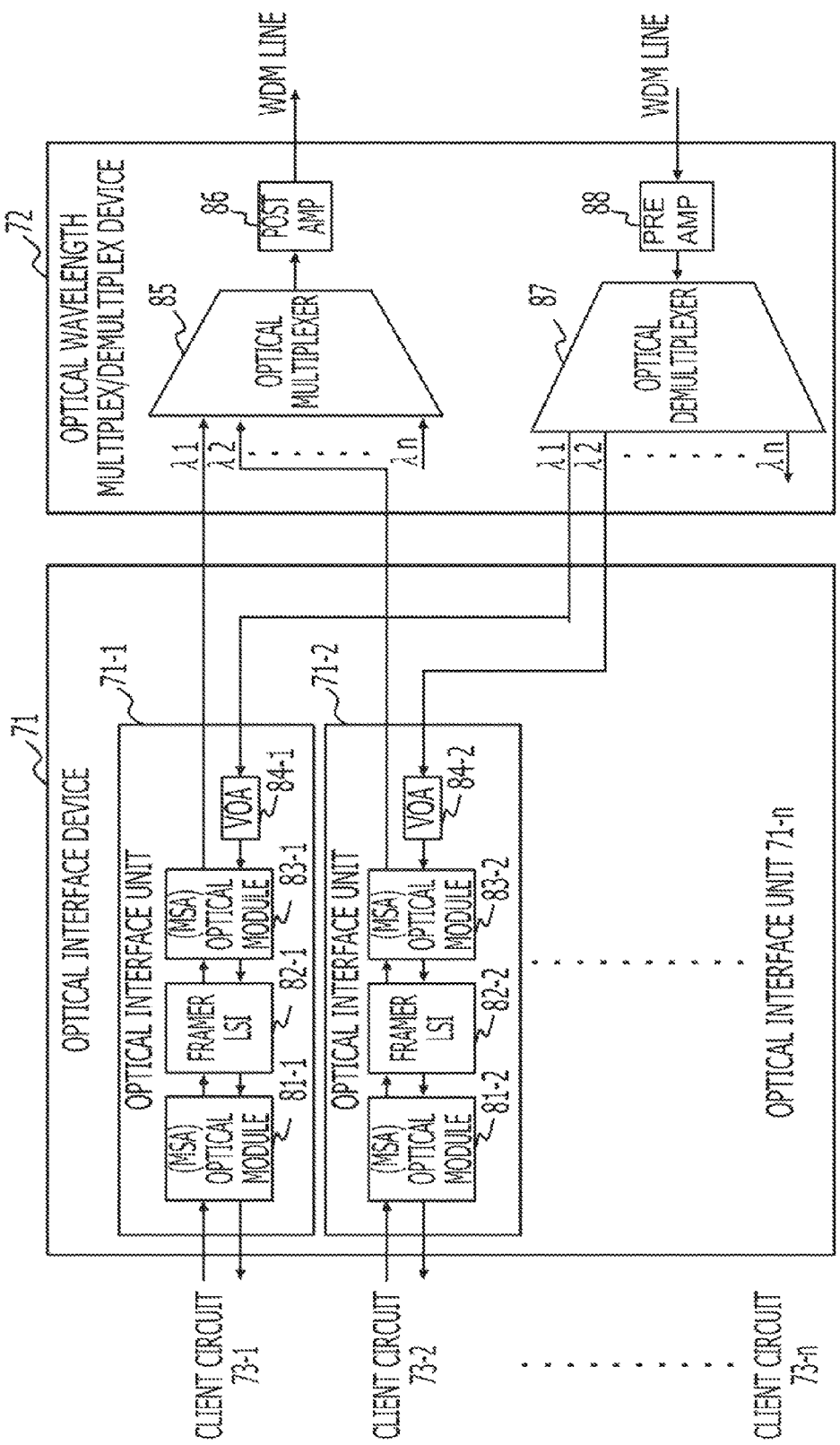

| ITU-T G. 738 02/2004 STANDARD | | | | | | | | |
|---|---|---|---|---|---|---|---|---|
| INPUT SIGNAL | | | $f_{CL}$ | | $f_{CH}$ | | JITTER TOLERANCE | |
| OC-48 (STM-16) | 2.4 | GHz | 5 | kHz | 20 | MHz | 0.3 | UIp-p |
| | | | 1 | MHz | 20 | MHz | 0.1 | UIp-p |
| OC-192 (STM-64) | 10 | GHz | 20 | kHz | 80 | MHz | 0.3 | UIp-p |
| | | | 4 | MHz | 80 | MHz | 0.1 | UIp-p |

TRANSFER APPARATUS, AND JITTER CONTROL METHOD OF TRANSMISSION SIGNAL

CROSS-REFERENCE TO RELATED APPLICATION

This application is based upon and claims the benefit of priority of the prior Japanese Patent Application No. 2009-255146, filed on Nov. 6, 2009, the entire contents of which are incorporated herein by reference.

FIELD

The embodiments discussed herein are related to a transfer apparatus, an interface unit, and a jitter control method of a transmission signal.

BACKGROUND

A high-capacity backbone communication line is demanded as a communication speed of a communication line such as the Internet increases. Wavelength division multiplex (WDM) techniques are used in the backbone communication line.

A relay apparatus of a communication network and a transfer apparatus such as a terminal apparatus extracts a clock signal from an input signal, and synchronizes a signal to the extracted clock signal. An oscillator is included in the transfer apparatus. The oscillator internally generates a clock signal if the input signal is interrupted.

A signal transfer apparatus is conventionally known which includes a plurality of programmable oscillators and outputs a signal of any frequency by summing output signals of the programmable oscillators (Japanese Laid-open Patent Publication No. 63-061594).

In another known technique, a correction Read Only Memory (ROM) storing correction digital data correcting an oscillation frequency is arranged in a programmable oscillator, and variations in the resistance value of a resistor and the capacitance value of a capacitor in the programmable oscillator are corrected by the correction ROM (Japanese Examined Utility Model No. 2527832).

SUMMARY

An example of an embodiment provides a transfer apparatus. The transfer apparatus includes a receiver to receive an input signal and to extract a clock signal from the input signal, an input signal interruption detector to detect whether an input signal is input, an oscillator, and a frequency setter to set an oscillation frequency of the oscillator such that a difference between the oscillation frequency of the oscillator and a frequency of a frequency division signal into which a clock signal extracted from the input signal is frequency-divided falls out of a passband width of a filter when the input signal interruption detector detects the input of the input signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 6 illustrates an optical interface device and a wavelength multiplex/demultiplex device;

DESCRIPTION OF EMBODIMENTS

Embodiments are described below. A transfer apparatus includes an oscillator in order to internally generate a clock signal during an input signal interruption. An optical signal suffers from a variation in a center frequency thereof. For example, an optical signal of synchronous optical network/synchronous digital hierarchy (SONET/SDH) has a frequency variation of ±20 ppm. If the optical signal has a frequency variation, a jitter is caused by an interfering signal having a frequency difference between a frequency of a clock signal extracted from an optical signal and an oscillation frequency of the oscillator. Since the oscillator itself suffers from a frequency variation thereof, the jitter may increase.

ITU-T G.738 Standard specifies jitter tolerance values as a signal quality of a transfer apparatus. The jitter tolerance value is 0.1 or 0.3 times the peak value of a signal.

Figure 1A:
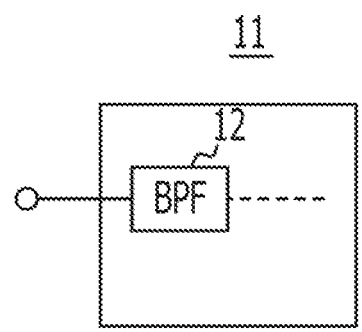
FIG. 1A illustrates a bandpass filter in a measurement device measuring a signal quality of a transfer apparatus.

FIG. 1A illustrates a bandpass filter 12 of a measurement device 11 measuring a signal quality of a transfer apparatus. The measurement device 11 includes the bandpass filter 12 having passband characteristics of 5 kHz to 20 MHz, for example.

Figure 1B:
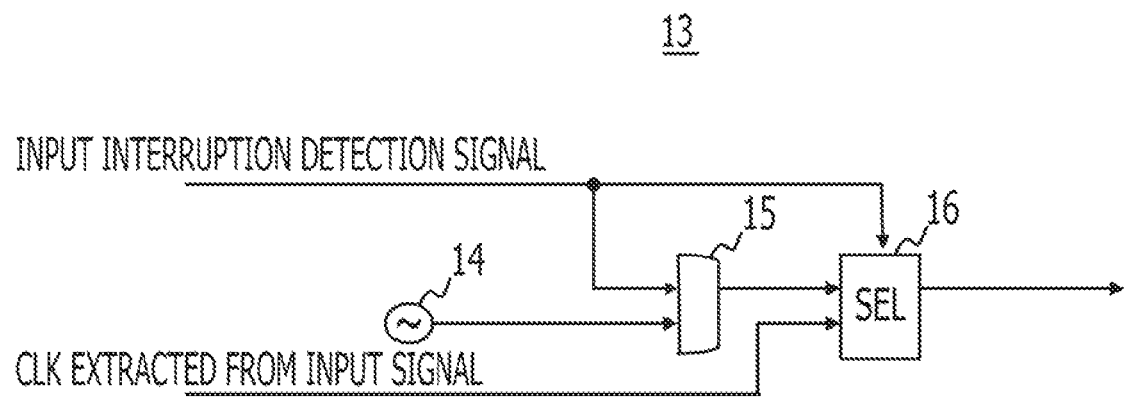
FIG. 1B illustrates an oscillator circuit.

In order to reduce the jitter of a signal in the transfer apparatus, an oscillator circuit 13 of FIG. 1B is contemplated. If an input signal is normally input, an AND gate 15 in the oscillator circuit 13 blocks an output of an oscillator 14.

The oscillator 14 generates an internal clock signal having substantially the same frequency as the frequency of a clock signal to be extracted from the input signal.

The AND gate 15 receives at one input terminal thereof the output signal from the oscillator 14, and at the other input terminal thereof an input interruption detection signal. With the input interruption detection signal at a low level, e.g., with the input signal being input normally, the AND gate 15 does not output the oscillation signal from the oscillator 14, for example.

A selector 16 receives at one input terminal thereof the output signal from the AND gate 15 and at the other input terminal thereof a clock signal CLK extracted from the input signal. The selector 16 receives the input interruption detection signal at a control input terminal thereof. The input interruption detection signal is at a low level in response to the normal input of the input signal, and at a high level in response to the interruption of the input signal, for example.

The selector 16 selects the output signal from the AND gate 15 with the input interruption detection signal at a high level, and selects the clock signal CLK with the input interruption detection signal at a low level.

In response to an interruption of the input signal, the selector 16 selects and outputs the oscillation signal of the oscillator 14.

Since the oscillator 14 operates in the oscillator circuit 13, an interfering signal having a frequency difference between the oscillation frequency of the oscillator 14 and the frequency of the clock signal extracted from the input signal is generated. The interfering signal leaks into a power source line. As a result, a frequency variation (jitter) is caused in the signal in the transfer apparatus by the interfering signal leaked into the power source line.

Figure 2:
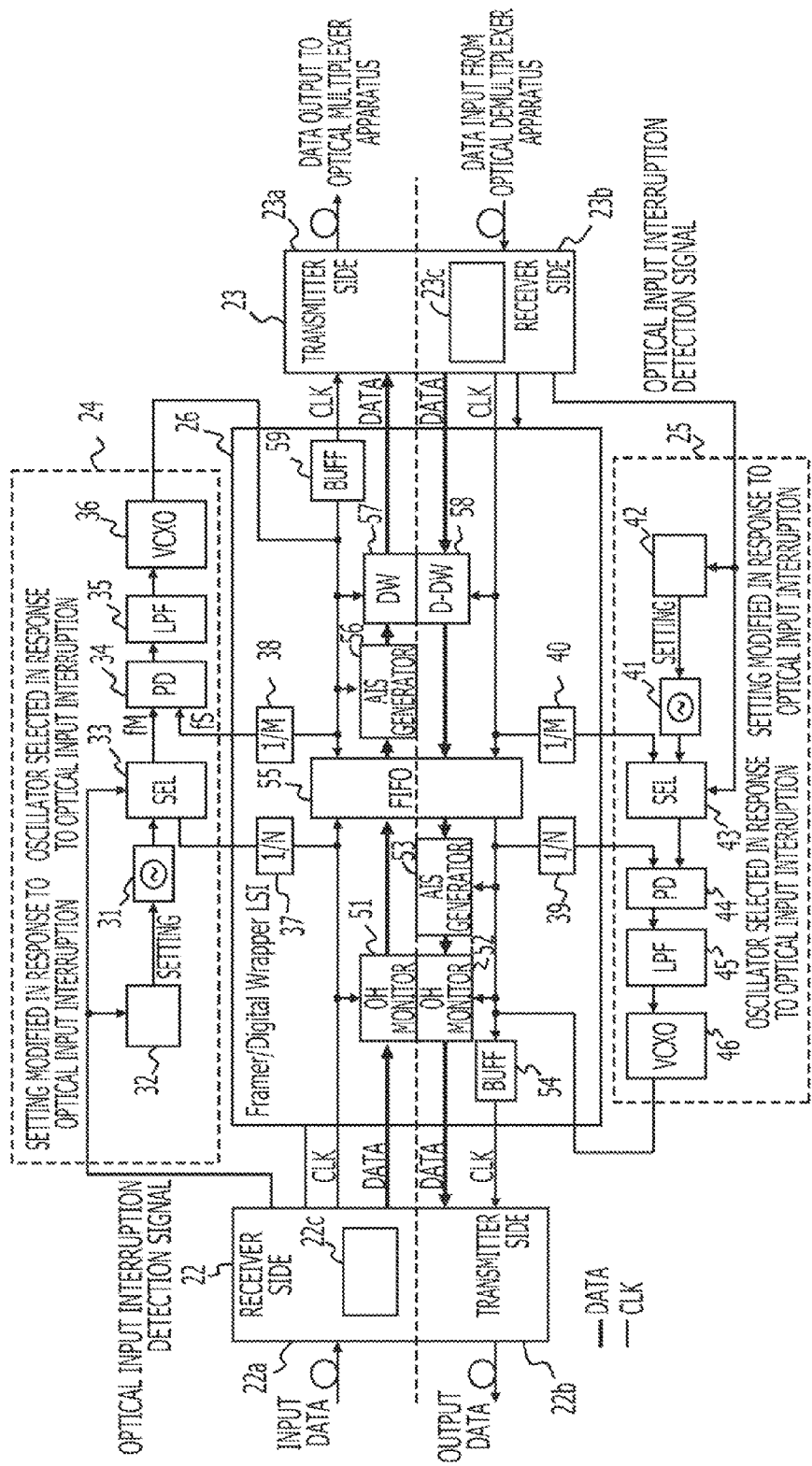
FIG. 2 illustrates a structure of an optical interface unit of one embodiment.

A technique to solve the above-described problem is described below as one embodiment. FIG. 2 illustrates a structure of an optical interface unit 21 used in the transfer apparatus of the embodiment.

The optical interface unit 21 includes optical modules 22 and 23, first phase-locked loop (PLL) unit 24 and second PLL unit 25 generating internal clock signals, and framer/digital wrapper LSI 26.

The optical module 22 includes a receiver-side module 22a, and a transmitter-side module 22b. The receiver-side module 22a converts an optical signal (input DATA) input from a client apparatus (terminal apparatus) (not shown) into an electrical signal including DATA and a clock CLK, and then outputs the electrical signal to the framer/digital wrapper LSI 26. The receiver-side module 22a includes an optical signal interruption detector 22c detecting an interruption of an optical signal input from the client apparatus. Upon detecting the interruption of the optical signal, the receiver-side module 22a validates the optical input interruption detection signal and outputs the optical input interruption detection signal to the first PLL unit 24.

The transmitter-side module 22b converts an electrical signal including DATA and a clock CLK output from the framer/digital wrapper LSI 26 into an optical signal having a wavelength matching an optical line of the client apparatus.

The optical module 23 includes a transmitter-side module 23a and a receiver-side module 23b. The transmitter-side module 23a converts the electrical signal, including the DATA and the clock CLK and converted by the framer/digital wrapper LSI 26, into an optical signal having a desired wavelength and then outputs the optical signal to an optical multiplexer apparatus.

The receiver-side module 23b converts an optical signal having a particular wavelength input from an optical demultiplexer apparatus into an electrical signal including DATA and a clock CLK, and then outputs the electrical signal to the framer/digital wrapper LSI 26. The receiver-side module 23b includes an optical signal interruption detector 23c detecting an interruption of the optical signal input from the optical demultiplexer apparatus. Upon detecting the optical signal interruption, the receiver-side module 23b validates the optical input interruption detection signal, and then outputs the optical input interruption detection signal to the second PLL unit 25.

In response to the interruption of the optical signal from the client apparatus, the first PLL unit 24 generates an internal clock signal for outputting an alarm indication signal (AIS) or the like to another apparatus.

The first PLL unit 24 includes programmable oscillator 31, frequency setter 32, selector 33, phase comparator 34, low pass filter 35, and voltage-controlled oscillator 36.

The first PLL unit 24 receives as a reference signal for phase comparison a signal into which the frequency of the clock signal CLK is divided by N.

The programmable oscillator 31 varies an oscillation frequency thereof by modifying external setting data from the outside.

The frequency setter 32 outputs the setting data determining the oscillation frequency of the programmable oscillator 31. The frequency setter 32 outputs the setting data to modify the oscillation frequency of the programmable oscillator 31 depending on whether the optical input interruption detection signal output from the optical signal interruption detector 22c is valid or invalid. The frequency setter 32 may employ a gate array such as a field programmable gate array (FPGA), for example.

If the optical signal is normally input with the optical input interruption detection signal being invalid (at a low level, for example), the frequency setter 32 sets the oscillation frequency of the programmable oscillator 31 as described below. For example, the frequency setter 32 outputs setting data to the programmable oscillator 31. The setting data causes a difference between the oscillation frequency and a frequency of a signal into which the clock signal CLK is frequency-divided by N (N is an integer equal to or greater than 1) (or an integer multiple of the difference, for example, N times the difference) to be outside of a passband width of a filter such as the bandpass filter 12.

In accordance with the present embodiment, the signal into which the clock signal CLK is divided by N is a reference signal fM for phase comparison. The frequency setter 32 sets the oscillation frequency of the programmable oscillator 31 as described below. The frequency setter 32 controls the oscillation frequency such that the difference between the oscillation frequency of the programmable oscillator 31 and the frequency of the frequency division signal into which the clock signal CLK is frequency-divided by N is set to be higher than the frequency that is obtained from dividing a cutoff frequency of a high-frequency side of the bandpass filter 12 by the frequency division value N.

Even if an interfering signal having the frequency equal to a difference between the oscillation frequency of the programmable oscillator 31 and the frequency of the frequency division signal resulting from dividing the clock signal CLK is generated, the bandpass filter 12 in the measurement device 11 may remove the jitter of the signal generated in response to the interfering signal.

Since the present embodiment is related to the transfer apparatus for transmitting the optical signal, the frequency difference is set to be equal to or higher than the cutoff frequency of the high-frequency side of the bandpass filter 12 taking into consideration the frequency variation of the optical signal. If the frequency of the clock signal is low, the difference between the oscillation frequency and the frequency obtained from dividing the clock signal may be set to be equal to or lower than the cutoff frequency of the low-frequency side of the bandpass filter 12.

If the optical input interruption detection signal is valid (at a high level, for example) during the optical signal interruption, the frequency setter 32 outputs the setting data that causes the oscillation frequency of the programmable oscillator 31 to be approximately equal to the frequency of the clock signal.

The selector 33 receives at one input terminal thereof the oscillation signal output from the programmable oscillator 31 and at the other input terminal thereof the signal into which a frequency divider 37 frequency-divides the clock signal CLK by N. The selector 33 also receives at a control terminal thereof the optical input interruption detection signal.

Depending on whether the optical input interruption detection signal input to the control terminal is valid or invalid, the selector 33 selects between the oscillation signal of the programmable oscillator 31 and the frequency division signal obtained from dividing the clock signal CLK by N and outputs the selected signal to the phase comparator (PD) 34. The output signal fM of the selector 33 is a reference frequency signal fM for phase comparison.

The phase comparator 34 compares the phase of the reference frequency signal fM output from the selector 33 with the phase of a signal fS into which a frequency divider 38 frequency-divides the output signal of the voltage-controlled oscillator 36 by M, and outputs a signal responsive to the phase difference therebetween to the low pass filter (LPF) 35. The frequency division value M is an integer equal to or greater than 1.

The low pass filter 35 outputs a control voltage to the voltage-controlled oscillator 36. The control voltage is a voltage into which the output signal of the phase comparator 34 is smoothed. The voltage-controlled oscillator (VCXO) 36 is an oscillator, the oscillation frequency of which is controlled by the control voltage output from the low pass filter 35. The voltage-controlled oscillator 36 outputs a signal having the oscillation frequency responsive to the control voltage to the framer/digital wrapper LSI 26.

Upon an interruption of the optical signal input from another transfer apparatus, the second PLL unit 25 generates an internal clock signal to output AIS or the like to the client apparatus.

The second PLL unit 25 includes programmable oscillator 41, frequency setter 42, selector 43, phase comparator 44, low pass filter 45, and voltage-controlled oscillator 46.

The programmable oscillator 41 varies an oscillation frequency thereof by modifying external setting data from the outside.

The frequency setter 42 outputs the setting data determining the oscillation frequency of the programmable oscillator 41. The frequency setter 42 outputs the setting data to modify the oscillation frequency of the programmable oscillator 41 depending on whether the optical input interruption detection signal output from the optical signal interruption detector 23c is valid or invalid. The frequency setter 42 may employ a gate array such as a field programmable gate array (FPGA).

If the optical signal is normally input with the optical input interruption detection signal being invalid (at a low level, for example), the frequency setter 42 sets the oscillation frequency of the programmable oscillator 41 as described below. For example, the frequency setter 42 outputs setting data to the programmable oscillator 41. The setting data causes a difference between the oscillation frequency and the frequency of the clock signal (or the frequency division signal obtained from dividing the clock signal) to be out of a passband width of the filter (bandpass filter) 12.

During the interruption of the optical signal, the frequency setter 42 outputs the setting data that causes the oscillation frequency of the programmable oscillator 41 to be approximately equal to the frequency of the clock signal CLK.

The selector 43, the phase comparator 44, the low pass filter 45 and the voltage-controlled oscillator 46 in the second PLL unit 25 are substantially identical in function to the selector 33, the phase comparator 34, the low pass filter 35, and the voltage-controlled oscillator 36 in the first PLL unit 24, respectively.

The framer/digital wrapper LSI 26 includes frequency dividers 37-40, overhead (OH) monitors 51 and 52 monitoring header information, AIS (alarm indication signal) generators 53 and 56, buffer 54, and first-in/first-out (FIFO) buffer 55. The framer/digital wrapper LSI 26 further includes digital wrapper (DW) 57, D-DW (decoding digital wrapper) 58, and buffer 59.

The OH monitor 51 monitors header information of the DATA input from the optical module 22. The OH monitor 52 monitors header information of the DATA input from another transfer apparatus.

The AIS generator 53 generates an AIS signal in response to the detection of the interruption of the input signal from the transfer apparatus at an opposite station.

The FIFO buffer 55 buffers the DATA and the clock signal CLK obtained from the optical signal input from the client apparatus and the DATA and the clock signal CLK obtained from the optical signal input from the transfer apparatus at the opposite station.

Upon detecting an interruption of the input signal from the client apparatus, the AIS generator 56 generates an AIS signal.

The digital wrapper 57 attaches a channel header and an error correction code forward error correction (FEC) to a data frame, respectively before and after the data frame output from the FIFO buffer 55, and outputs the resulting data to the transmitter-side module 23a.

The decoding digital wrapper 58 removes a channel header and an error correction code FEC attached to a data frame, respectively before and after the data frame output from the receiver-side module 23b, and then outputs the data frame to the FIFO buffer 55.

The buffer 59 buffers the oscillation signal output from the first PLL unit 24 and then outputs the resulting oscillation signal as the clock signal CLK to the transmitter-side module 23a and the FIFO buffer 55.

Figure 3:
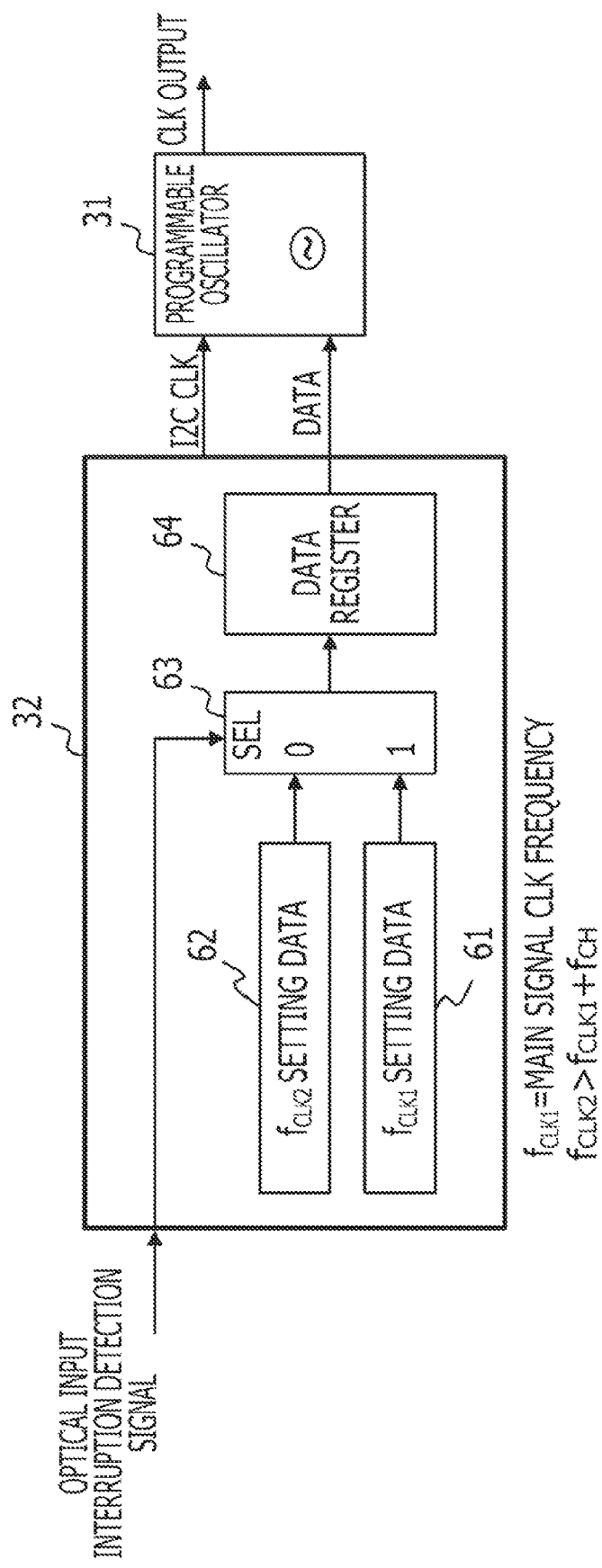
FIG. 3 illustrates a frequency setter and a programmable oscillator.

FIG. 3 illustrates the programmable oscillator 31 and the frequency setter 32. The frequency setter 32 includes registers 61 and 62, selector 63, and data register 64 storing output data of the selector 63. The frequency setter 42 is substantially identical in structure to the frequency setter 32.

The register 61 stores setting data (second setting data) specifying a main signal clock frequency fCLK1 as the frequency of the clock signal CLK extracted from the optical signal.

The register 62 stores setting data (first setting data) specifying a frequency fCLK2 higher than the sum of the main signal clock frequency fCLK1 and the cutoff frequency fCH of the high-frequency side of the bandpass filter 12.

Depending on whether the optical input interruption detection signal input to the control terminal, the selector 63 selects one of the two pieces of setting data respectively input to the two input terminals thereof and then outputs the selected setting data to the data register 64.

If the optical input interruption detection signal is invalid (at a low level), e.g., if the optical signal is normally input, the selector 63 selects the setting data specifying the frequency fCLK2 stored on the register 62, and then outputs the selected setting data to the data register 64.

If the optical input interruption detection signal is valid, e.g., during an optical signal interruption, the selector 63 selects the setting data specifying the main signal clock frequency fCLK1 stored on the register 61, and outputs the selected setting data to the data register 64.

The data register 64 outputs the setting data from the selector 63 to the programmable oscillator 31 at a timing in synchronization with I2C clock.

If the optical signal is normally input, the programmable oscillator 31 receives the setting data that specifies the frequency fCLK2 higher than the sum of the frequency fCLK1 of the clock signal CLK and the cutoff frequency fCH of the high-frequency side of the bandpass filter 12. As a result, the programmable oscillator 31 generates the frequency fCLK2.

On the other hand, if the optical input interruption detection signal is valid, e.g., during the optical signal interruption, the programmable oscillator 31 receives the setting data specifying the frequency fCLK1 equal to the frequency of the clock signal CLK. As a result, the programmable oscillator 31 generates the frequency fCLK1 equal to the frequency of the clock signal CLK.

As illustrated in FIG. 3, a data communication process is performed between the data register 64 and the programmable oscillator 31 in serial communication of I2C (inter-integrated circuit). The frequency setter 32 outputs to the programmable oscillator 31a clock signal I2C CLK for serial communication determining a transmission timing of data. The frequency setter 32 thus outputs serial data at a timing synchronized with the serial communication clock signal.

The frequency setter 32 is not limited in structure to the circuit arrangement of FIG. 3. The frequency setter 32 may not include the selector 63. The frequency setter 32 without the selector 63 may read the setting data by specifying an address on a register or a memory storing the setting data specifying the oscillation frequency depending on whether the optical input interruption detection signal is valid or invalid. Even if the selector 63 is employed, the frequency setter 32 may not include the data register 64 and may output the output of the selector 63 as is to the programmable oscillator 31. The communication operation between the frequency setter 32 and the programmable oscillator 31 is not limited to I2C. Data may be directly output from the frequency setter 32 to the programmable oscillator 31.

Figure 4:
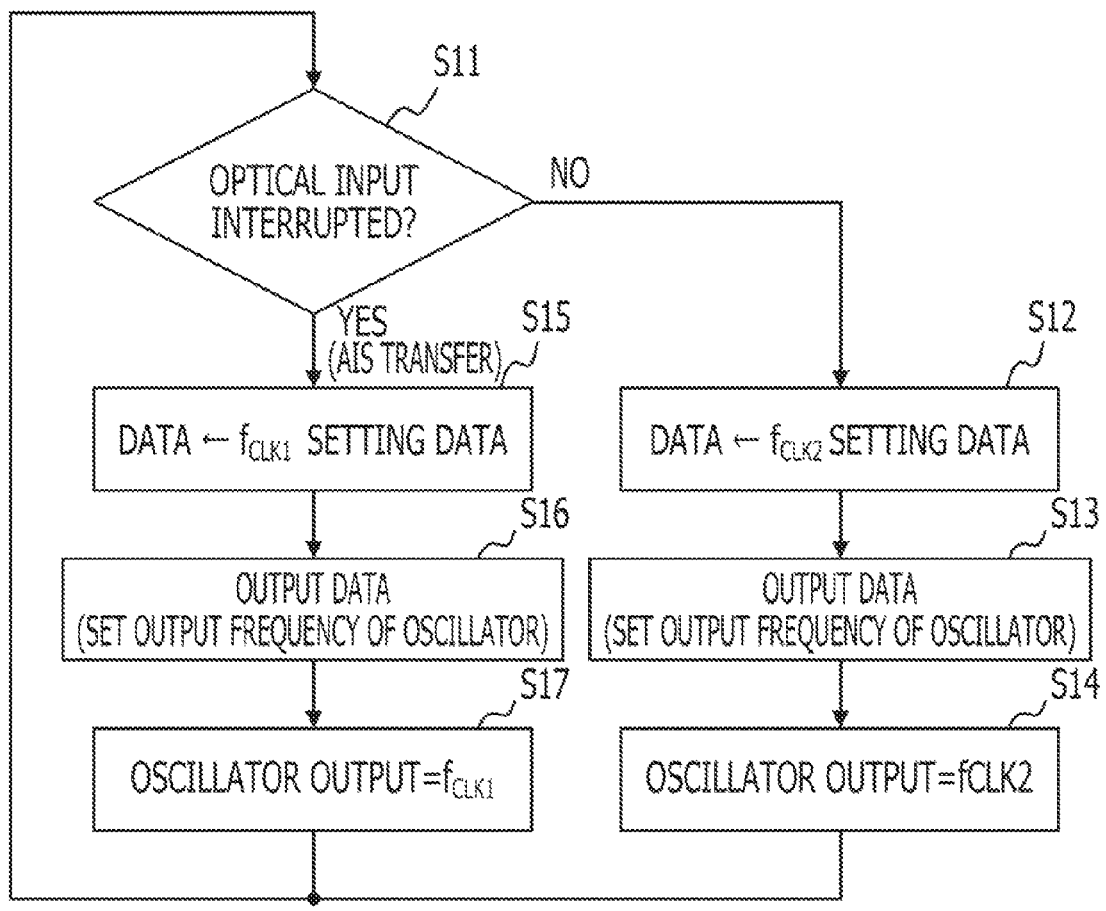
FIG. 4 illustrates a function of the frequency setter.

FIG. 4 illustrates the function of the frequency setter 32 wherein the frequency setter 32 is implemented using software, for example.

The frequency setter 32 determines whether the optical input is interrupted or not (operation 11). If the frequency setter 32 determines in operation 11 that the optical signal is normally input and not interrupted (no branch from operation 11), processing proceeds to operation 12. The frequency setter 32 sets the setting data specifying the frequency fCLK2 higher than the sum of the clock signal frequency fCLK1 extracted from the optical signal and the cutoff frequency fCH of the high-frequency side of the bandpass filter 12.

The setting data specifying the frequency fCLK2 is output to the programmable oscillator 31 (operation 13). If the optical signal is normally input, the programmable oscillator 31 oscillates at the frequency fCLK2 (operation 14).

If it is determined in operation 11 that the optical input is interrupted (yes branch from operation 11), processing proceeds to operation 15. The frequency setter 32 then sets the setting data specifying the frequency fCLK1 of the clock signal CLK extracted from the optical signal.

The frequency setter 32 outputs to the programmable oscillator 31 the setting data specifying the frequency fCLK1 (operation 16). As a result, the programmable oscillator 31 oscillates at the frequency fCLK1 in response to the optical signal interruption.

If the function of the frequency setter 32 is implemented employing software as described above, the frequency of the interfering signal between the oscillation signal of the programmable oscillator 31 and the clock signal CLK is set to be outside of the passband width (within the stopband width) of the bandpass filter 12.

Figure 5:
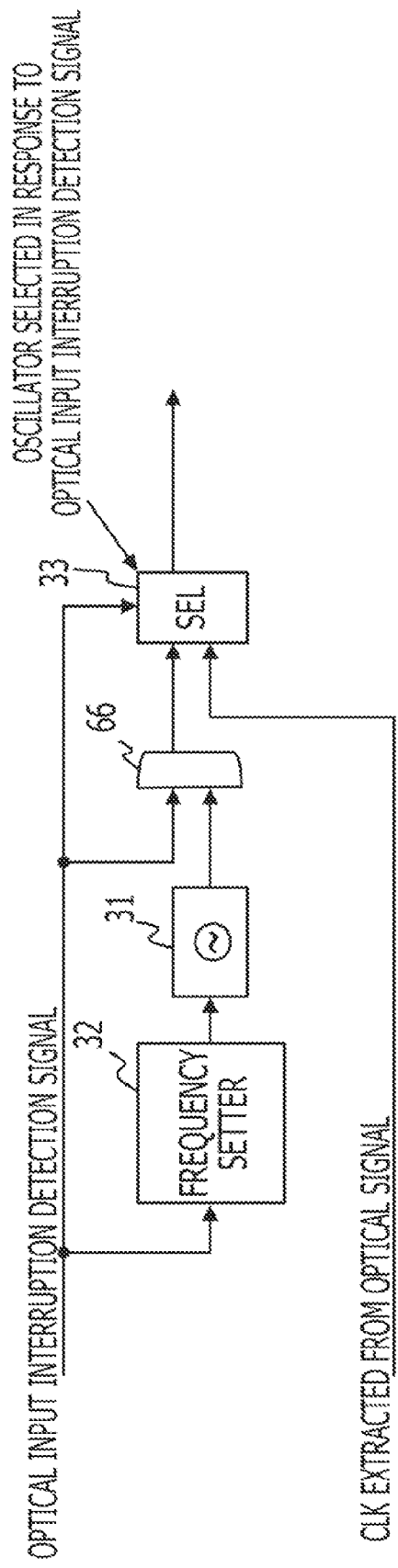
FIG. 5 illustrates a structure of a phase-locked loop (PLL) unit.

FIG. 5 illustrates a structure of major elements of the first PLL units 24 and 25. The programmable oscillator 31, the frequency setter 32, and the selector 33 are identical to those in the first PLL unit 24 of FIG. 2. The first PLL unit 24 of FIG. 5 is different from the first PLL unit 24 of FIG. 2 in that an AND gate 66 is additionally included.

The AND gate 66 receives at one input terminal thereof the optical input interruption detection signal and at the other input terminal thereof the output signal from the programmable oscillator 31. The output of the AND gate 66 is input to one input terminal of the selector 33.

The oscillation signal of the programmable oscillator 31 is output from the AND gate 66 to the selector 33 only if the optical input interruption detection signal is at a high level (valid).

With the optical input interruption detection signal at a low level (invalid), e.g., with the optical signal normally input, the selector 33 selects and outputs the clock signal CLK extracted from the optical signal.

With the optical input interruption detection signal at a high level (valid), e.g., with the optical signal interrupted, the selector 33 selects and outputs the oscillation signal output from the AND gate 66.

FIG. 6 illustrates an optical interface device 71 and an optical wavelength multiplex/demultiplex device 72.

The optical interface device 71 includes n optical interface units 71-1 through 71-n responsive to the number of wavelengths of the optical wavelength multiplex/demultiplex device 72. Each of the optical interface units 71-1 through 71-n is basically identical in structure to the optical interface unit 21 of FIG. 2.

The optical interface unit 71-1 includes optical module 81-1, framer LSI 82-1, optical module 83-1, and variable optical attenuator (VOA) 84-1. FIG. 6 illustrates optical modules 81-1 through 81-n, and 84-1 through 84-n complying with the multi-source agreement (MSA) specifications.

Input and output of the optical module 81-1 in the optical interface unit 71-1 are connected to a client line 73-1 as an optical signal destination. Similarly, inputs and outputs of the optical modules 81-2 through 81-n (not illustrated) in the optical interface units 71-2 through 71-n are respectively connected to client lines 73-2 through 73-n as optical signal destinations.

The optical modules 81-1, and 83-1 are respectively identical to the optical modules 22 and 23 illustrated in FIG. 2. The framer LSI 82-1 is identical to the framer/digital wrapper LSI 26 illustrated in FIG. 2. The VOA 84-1 adjusts the level of an optical signal input from the optical demultiplexer 87.

The optical wavelength multiplex/demultiplex device 72 includes optical multiplexer 85, post-amplifier (post-AMP) 86, optical demultiplexer 87, and pre-amplifier (pre-AMP) 88. The post-amplifier 86 amplifies a wavelength-multiplexed optical signal and then outputs the optical signal to a wavelength division multiplex (WDM) line. The pre-amplifier 88 amplifies an optical signal input via a WDM line, and then outputs the amplified optical signal to the optical interface device 71.

Optical signals λ1-λn wavelength-converted by the optical interface units 71-1 through 71-n in the optical interface device 71 are input to the optical multiplexer 85. The optical multiplexer 85 multiplexes the optical signals λ1-λn, and then output the multiplexed optical signal to the post-amplifier 86.

The optical demultiplexer 87 demultiplexes the wavelength-multiplexed signal input via the WDM line and amplified by the pre-amplifier 88 into optical signals having wavelengths λ1-λn. The optical signals having the wavelengths λ1-λn demultiplexed by the optical demultiplexer 87 are output to the variable optical attenuators (VOAs) 84-1 through 84-n in the optical interface units 71-1 through 71-n.

Figures 7A, 7B:
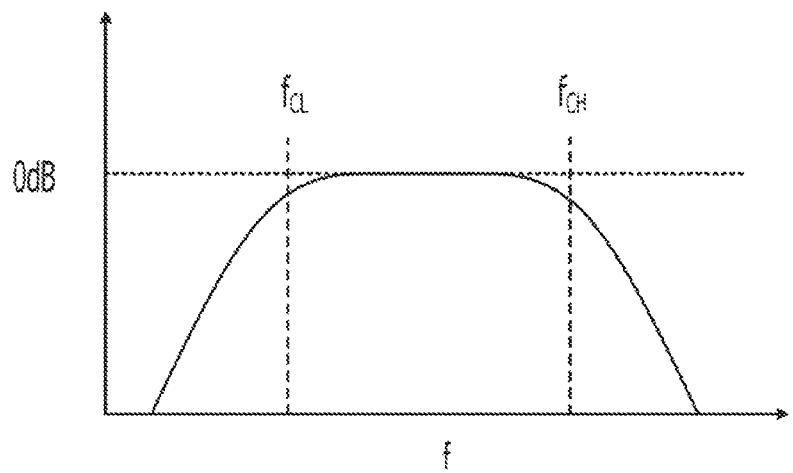
FIG. 7A illustrates frequency characteristics of a bandpass filter of the measurement device.
FIG. 7B illustrates a cutoff frequency and jitter tolerance in accordance with ITU-T G.738 standard.

FIG. 7A illustrates frequency characteristics of the bandpass filter 12 of the measurement device. FIG. 7B illustrates the cutoff frequency and the jitter tolerance of ITU-T G.738 standards.

Let fCL represent the cutoff frequency of the low-frequency side of the bandpass filter 12 of the measurement device and let fCH represent the cutoff frequency of the high-frequency side of the bandpass filter 12.

In response to an input signal frequency of 2.4 GHz on OC-48 (STM-16) in ITU-T G.738, the cutoff frequency fCL of the low-frequency side of the bandpass filter 12 is 5 kHz or 1 MHz, and the cutoff frequency fCH of the high-frequency side of the bandpass filter 12 is 20 MHz. The jitter tolerance value is 0.3 or 0.1 times the peak value of a signal waveform.

In response to an input signal frequency of 10 GHz on OC-192 (STM-64), the cutoff frequency fCL of the low-frequency side of the bandpass filter 12 is 20 kHz or 4 MHz, and the cutoff frequency fCH of the high-frequency side of the bandpass filter 12 is 80 MHz. The jitter tolerance value is 0.3 or 0.1 times the peak value of a signal waveform.

Described below is the oscillation frequency of the programmable oscillator 31 with the input signal normally input thereto in OC-48 (STM-16) and OC-192 (STM-64).

(i) Input Signal of 2.48832 GHz in OC-48 (STM-16)

The cutoff frequency fCH of the high-frequency side of the bandpass filter 12 is 20 MHz as illustrated in FIG. 7B.

If the reference frequency for phase comparison is identical to the frequency of the input signal with the input signal normally input (the frequency division value N=1), the oscillation frequency of the programmable oscillator 31 is set to be higher than the following frequency:

2.48832 GHz+20 MHz=2.50832 GHz

If the reference frequency for phase comparison is $\frac{1}{32}$ times the input signal frequency (with the frequency division value N=32), namely, 77.76 MHz, the oscillation frequency fCLK2 of the programmable oscillator 31 (or 41) is set to be higher than the frequency described below.

The oscillation frequency fCLK2 of the programmable oscillator 31 is set to be higher than the sum of 77.76 MHz and 0.625 MHz resulting from multiplying the cutoff frequency 20 MHz of the high-frequency side of the bandpass filter 12 by $\frac{1}{32}$:

fCLK2=77.76 MHz+0.625 MHz=78.385 MHz

If the reference signal for phase comparison is $\frac{1}{64}$ times the input signal frequency (the frequency division value N=64), namely, 38.88 MHz, the frequency fCLK2 of the programmable oscillator 31 with the input signal normally input thereto is set to be higher than the frequency described below.

The oscillation frequency fCLK2 of the programmable oscillator 31 is set to be higher than the sum of 33.88 MHz and 0.3125 MHz resulting from multiplying the cutoff frequency 20 MHz of the high-frequency side of the bandpass filter 12 by $\frac{1}{64}$:

fCLK2=38.88 MHz+0.3125 MHz=39.1925 MHz

If the reference signal for phase comparison is $\frac{1}{16}$ times the input signal frequency, namely, 155.52 MHz, the frequency fCLK2 of the programmable oscillator 31 with the input signal normally input thereto is set to be higher than the frequency described below.

The oscillation frequency fCLK2 of the programmable oscillator 31 is set to be higher than the sum of 155.52 MHz and the cutoff frequency 20 MHz of the high-frequency side of the bandpass filter 12 multiplied by $\frac{1}{16}$:

fCLK2=155.52 MHz+1.25 MHz=156.77 MHz (ii) Input Signal of 9.95328 GHz in OC-192 (STM-64)

The cutoff frequency fCH of the high-frequency side of the bandpass filter 12 is 80 MHz as illustrated in FIG. 7B.

If the reference frequency for phase comparison is equal to the frequency of the input signal 9.95328 GHz with the input signal normally input (the frequency division value N=1), the oscillation frequency of the programmable oscillator 31 is set to be higher than the following frequency:

fCLK2=9.95328 GHz+80 MHz=10.03328 GHz

If the reference frequency for phase comparison is $\frac{1}{128}$ times the input signal frequency (with the frequency division value N=128), namely, 77.76 MHz, the oscillation frequency fCLK2 of the programmable oscillator 31 is set to be higher than the frequency described below.

The oscillation frequency fCLK2 of the programmable oscillator 31 is set to be higher than the sum of 77.76 MHz and the cutoff frequency 80 MHz of the high-frequency side of the bandpass filter 12 multiplied by $\frac{1}{128}$:

fCLK2=77.76 MHz+0.625 MHz=78.385 MHz

If the reference signal for phase comparison is $\frac{1}{256}$ times the input signal frequency (the frequency division value N=256), 38.88 MHz, the frequency fCLK2 of the programmable oscillator 31 with the input signal normally input thereto is set to be higher than the frequency described below.

The oscillation frequency fCLK2 of the programmable oscillator 31 is set to be higher than the sum of 33.88 MHz and the cutoff frequency 80 MHz of the high-frequency side of the bandpass filter 12 by $\frac{1}{256}$:

fCLK2=38.88 MHz+0.3125 MHz=39.1925 MHz

If the reference signal for phase comparison is $\frac{1}{64}$ times the input signal frequency (the frequency division value N=64), 155.52 MHz, the frequency fCLK2 of the programmable oscillator 31 with the input signal normally input thereto is set to be higher than the frequency described below.

fCLK2=155.52 MHz+1.25 MHz=156.77 MHz

In accordance with the above-described embodiments, the difference between the oscillation frequency of the programmable oscillator 31 and the frequency of the clock signal (or the signal obtained from frequency-dividing the clock signal) extracted from the optical signal is set to be out of the passband width of the bandpass filter 12 in the measurement device 11. This arrangement controls the jittering of the output signal of the transfer apparatus measured by the measurement device 11.

The embodiments are applied to the optical interface unit of the optical transfer apparatus. The embodiments are not limited to optical signal. The embodiments are applied to an electrical interface unit converting an electrical signal, a radio interface unit converting a radio signal, and a transfer apparatus of each of these units.

The passband width of the bandpass filter is not limited to the frequency bandwidth described above. The passband width may be a different frequency band. The embodiments may be further applied to a filter besides the bandpass filter.

ADVANTAGES

The transfer apparatus discussed herein provides the advantage that the jitter of the output signal is controlled.

All examples and conditional language recited herein are intended for pedagogical objects to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A transfer apparatus comprising:
   a receiver to receive an input signal and to extract a clock signal from the input signal;
   an input signal interruption detector to detect whether the input signal is input;
   an oscillator; and
   a frequency setter to set an oscillation frequency of the oscillator such that a difference between the oscillation frequency and a frequency of a frequency division signal into which the clock signal is frequency-divided is outside of a passband width of a filter when the input signal interruption detector detects the input of the input signal.

2. A transfer apparatus comprising:
   a receiver to receive an input signal and to extract a clock signal from the input signal;
   an input signal interruption detector to detect whether the input signal is input;
   an oscillator; and
   a frequency setter to set an oscillation frequency of the oscillator such that a difference between the oscillation frequency and a frequency of a frequency division signal into which a clock signal extracted from the input signal is frequency-divided by a frequency division value N (N is an integer equal to or greater than 1) is higher than or lower than a frequency that is obtained from dividing a cutoff frequency of a filter by the frequency division value N when the input signal interruption detector detects the input of the input signal.

3. The transfer apparatus according to claim 1, wherein:
   the filter is a bandpass filter of a measurement device measuring a signal quality;
   the clock signal is frequency divided by a frequency division value N (N is an integer equal to or greater than 1); and
   the frequency setter sets the oscillation frequency such that the difference between the oscillation frequency and the frequency of the frequency division signal is higher than a frequency obtained from dividing a cutoff frequency of a high-frequency side of the bandpass filter by the frequency division value N when the input signal interruption detector detects the input of the input signal.

4. The transfer apparatus according to claim 2, further comprising:
   a selector to receive at a control terminal thereof an input interruption detection signal from the input signal interruption detector, the input interruption detection signal indicating whether the input signal has been interrupted, to select between the oscillation signal of the oscillator and the frequency division signal obtained from dividing the clock signal in response to the input interruption detection signal, and to output the selected signal as a reference signal for phase comparison;
   a phase comparator to compare a phase of the reference signal output from the selector with a phase of a second frequency division signal obtained from dividing an output signal of a voltage-controlled oscillator;
   a low pass filter to smooth the output signal of the phase comparator; and
   a voltage-controlled oscillator to control the oscillation frequency thereof in response to a control voltage output from the low pass filter,
   wherein the frequency setter sets the oscillation frequency of the oscillator such that the difference between the oscillation frequency of the oscillator and the frequency of the frequency division signal is higher than a frequency that is obtained from dividing the cutoff frequency of the filter by the frequency division value N.

5. The transfer apparatus according to claim 1,
   wherein the oscillator is a programmable oscillator, and
   wherein the frequency setter comprises:
      a first register to store first setting data specifying a frequency higher than a sum of the frequency of the frequency division signal into which the clock signal is frequency-divided by a frequency division value N (N is an integer equal to or greater than 1) and a frequency that is obtained from dividing the cutoff frequency of a high-frequency side of the filter by the frequency division value N;
      a second register to store second setting data specifying a same frequency as the frequency of the clock signal; and
      a selector circuit to select the first setting data and to output the first setting data to the programmable oscillator when the input signal is input, and to select the second setting data and to output the second setting data to the programmable oscillator when an input signal interruption is detected.

6. A jitter control method of a transmission signal, comprising:
   receiving an input signal;
   extracting a clock signal from the input signal;
   detecting whether the input signal is input;
   extracting from the input signal a clock signal;
   frequency-dividing the extracted clock signal by a frequency division value of N (N is an integer equal to or greater than 1); and
   setting an oscillation frequency of an oscillator such that a difference between the oscillation frequency of the oscillator and a frequency of the frequency division signal is outside of a passband width of a filter when the input of the input signal is detected.

7. The jitter control method according to claim 6,
   wherein the filter is a bandpass filter of a measurement device measuring a signal quality; and
   wherein the setting sets the oscillation frequency of the oscillator such that the difference between the oscillation frequency and the frequency of the frequency division signal is higher than a frequency that is obtained from dividing a cutoff frequency of the filter by the frequency division value N when the input of the input signal is detected.

8. The jitter control method according to claim 6, further comprising:
   storing first setting data specifying a frequency higher than a sum of a frequency of the frequency division signal and a frequency that is obtained from dividing the cutoff frequency of a high-frequency side of the filter by the frequency division value N;
   storing second setting data specifying a same frequency as the frequency of the clock signal;
   controlling the oscillation frequency of the oscillator in response to the first setting data when the input signal is input; and
   controlling the oscillation frequency of the oscillator in response to the second setting data when an input signal interruption is detected.

* * * * *